United States Patent
Choi et al.

(10) Patent No.: US 9,936,462 B2
(45) Date of Patent: Apr. 3, 2018

(54) RATE ADAPTATION USING SEMI-OPEN LOOP TECHNIQUE

(71) Applicant: QUALCOMM Incorporated, San Diego, CA (US)

(72) Inventors: Won-Joon Choi, Santa Clara, CA (US); Ning Zhang, Santa Clara, CA (US); Huanchun Ye, Santa Clara, CA (US); Jeffrey M. Gilbert, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 23 days.

(21) Appl. No.: 14/739,083

(22) Filed: Jun. 15, 2015

(65) Prior Publication Data

US 2015/0282097 A1 Oct. 1, 2015

Related U.S. Application Data

(63) Continuation of application No. 11/329,979, filed on Jan. 10, 2006, now abandoned.

(60) Provisional application No. 60/643,459, filed on Jan. 12, 2005.

(51) Int. Cl.
| | |
|---|---|
| *H04J 3/00* | (2006.01) |
| *H04W 52/24* | (2009.01) |
| *H04L 1/00* | (2006.01) |
| *H04L 1/20* | (2006.01) |
| *H04L 25/02* | (2006.01) |
| *H04L 12/801* | (2013.01) |
| *H04L 12/825* | (2013.01) |
| *H04B 7/0413* | (2017.01) |
| *G01R 29/26* | (2006.01) |
| *H04L 1/16* | (2006.01) |

(52) U.S. Cl.
CPC .......... *H04W 52/24* (2013.01); *H04B 7/0413* (2013.01); *H04L 1/0002* (2013.01); *H04L 1/0003* (2013.01); *H04L 1/0016* (2013.01); *H04L 1/20* (2013.01); *H04L 25/0204* (2013.01); *H04L 47/10* (2013.01); *H04L 47/263* (2013.01); *G01R 29/26* (2013.01); *H04L 1/0009* (2013.01); *H04L 1/1607* (2013.01)

(58) Field of Classification Search
CPC ..................................................... H04W 52/24
USPC ....................................................... 375/285
See application file for complete search history.

(56) References Cited

U.S. PATENT DOCUMENTS

| | | |
|---|---|---|
| 6,452,348 B1 | 9/2002 | Toyoda |
| 6,611,231 B2 | 8/2003 | Crilly, Jr. et al. |
| 2003/0022686 A1 | 1/2003 | Soomro et al. |

(Continued)

OTHER PUBLICATIONS

ISA/US, International Search Report and Written Opinion of the International Searching Authority, Int'l. App. No. PCT/US2006/001244, dated Sep. 25, 2007,U.S. Commissioner for Patents, Alexandria, US, 6 pgs.

(Continued)

*Primary Examiner* — Christopher R Crompton
(74) *Attorney, Agent, or Firm* — Holland & Hart LLP/Qualcomm

(57) ABSTRACT

In a semi-open loop rate adaptation scheme for a multiple-input multiple-output (MIMO) system, a transmitter can advantageously use one or more quality metrics of an uplink as well as knowledge of device characteristics of both ends to perform fast and accurate rate adaptation.

30 Claims, 4 Drawing Sheets

(56) References Cited

U.S. PATENT DOCUMENTS

| | | | |
|---|---|---|---|
| 2003/0048856 A1* | 3/2003 | Ketchum | H04L 1/0009 375/260 |
| 2003/0125040 A1* | 7/2003 | Walton | H04B 7/0417 455/454 |
| 2003/0129943 A1 | 7/2003 | Park et al. | |
| 2004/0120411 A1 | 6/2004 | Walton et al. | |
| 2004/0157567 A1 | 8/2004 | Jootar et al. | |
| 2004/0171385 A1* | 9/2004 | Haustein | H04B 7/0413 455/450 |
| 2005/0075085 A1* | 4/2005 | Asirvatham | H03G 3/3042 455/127.1 |
| 2005/0163252 A1* | 7/2005 | McCallister | H03F 1/3247 375/296 |
| 2005/0180369 A1 | 8/2005 | Hansen et al. | |

OTHER PUBLICATIONS

Microsoft Computer Dictionary, 2002 Microsoft Press 5th, MC68000, 1 pg.

Takumi et al., "Adaptive Transmission Rate Control Scheme for ABR Services in the CBR and ABR Services Integrated DS/CDMA Systems," IEEE 52nd Vehicular Technology Conference, Boston, MA, Sep. 24-28, 2000, IEEE-VTS Fall VTC 2000, pp. 2121-2125, vol. 5, Institute of Electrical and Electronics Engineers.

TIPO, Taiwan Search Report, TW App. No. 095101284, dated Mar. 14, 2012, Taiwan Intellectual Property Office, Taipei, Taiwan, 1 pg.

* cited by examiner

RATE ADAPTATION USING SEMI-OPEN LOOP TECHNIQUE

CROSS REFERENCES

The present application for patent is a continuation of U.S. patent application Ser. No. 11/329,979 by Choi et al., entitled "Rate Adaptation Using Semi-Open Loop Technique," filed Jan. 10, 2006; which claims priority to U.S. Provisional Patent Application No. 60/643,459 by Choi et al., entitled "Rate Adaptation Using Semi-Open Loop Techniques," filed Jan. 12, 2005; each of which is assigned to the assignee hereof, and expressly incorporated by reference herein.

BACKGROUND

Field of the Disclosure

The present invention relates to rate adaptation in a wireless environment and in particular to using a semi-open loop technique to achieve an optimized rate.

Description of Related Art

Because the condition of a channel in a wireless environment varies over time, rate adaptation can be advantageously used to achieve optimized throughput in a system with multiple PHY (i.e., physical device) rates. Rate adaptation is especially important in a multiple-input multiple-output (MIMO) system because the number of streams introduces yet another dimension to the channel condition. In general, there are two categories of rate adaptation techniques: a closed-loop rate adaptation and an open-loop rate adaptation.

In the closed-loop rate adaptation, the intended receiver estimates some function of its receive signal (e.g., the channel state information (CSI)), and sends it back to the transmitter. The transmitter determines the optimized rate for its next transmission based on the feedback from the receiver. Unfortunately, this closed-loop rate adaptation has significant system overhead associated with determining the appropriate feedback.

In the open-loop rate adaptation, the transmitter uses trial and error to determine an optimized rate. Thus, the open-loop rate adaptation scheme does not incur any feedback overhead. However, because the transmitter receives no feedback from the receiver, the rate is typically slow to change and can result in errors as incorrect rates are selected.

Therefore, a need arises for a fast and accurate rate adaptation technique that minimizes system overhead.

SUMMARY

A method for quickly and accurately adapting a rate in a multiple-input multiple-output (MIMO) system while minimizing system overhead is described. This system can include first and second nodes in which transmissions from the first node to the second node are on a "downlink channel" and transmissions from the second node to the first node are on an "uplink channel." Each node in the MIMO system can include multiple transmitters and receivers.

In this method, the first node can estimate the uplink channel using a packet sent by the second node to the first node. This uplink channel can be transposed to provide an estimated downlink channel. The first node can use transmitter and receiver characteristics from both the first and second nodes and the estimated downlink channel to accurately adapt the rate. Notably, the receiver characteristics can include the sensitivity of the second node.

In one embodiment, using the transmitter and receiver characteristics can include computing a post-detection signal to noise ratio (SNR) of the second node based on the estimated downlink channel, noise floor information from the second node, and a receiver structure of the second node. This post-detection SNR can be adjusted with a transmit output power of the second node for a received data rate of the packet. After the adjusting, an estimated post-detection SNR for each rate at the second node can be computed using the transmitter power per rate of the first node, thereby building a sensitivity table for the second node. If the transmitter error vector magnitude (EVM) is not negligible, then the estimated post-detection SNR for each rate at the second node can be adjusted with a transmitter EVM per power of the first and second nodes.

The first node can use the sensitivity table to choose the optimized rate. In one embodiment, using the sensitivity table can include choosing the highest rate whose estimated post-detection SNR is larger than a threshold SNR.

A node that can quickly and accurately adapting its rate in a MIMO system is also described. This node includes various tables that can be accessed by software with computer-implementable instructions. Specifically, the node can include a table that indicates the post-detection SNR for rates at another node in the MIMO system. The node can further include a table that indicates transmitter output power per rate at the node as well as a table that indicates a transmitter EVM per power of the node and the other node. Notably, the node can further include software with computer-implementable instructions for accessing the above-described tables and performing the above-described steps.

DETAILED DESCRIPTION

Figure 1:
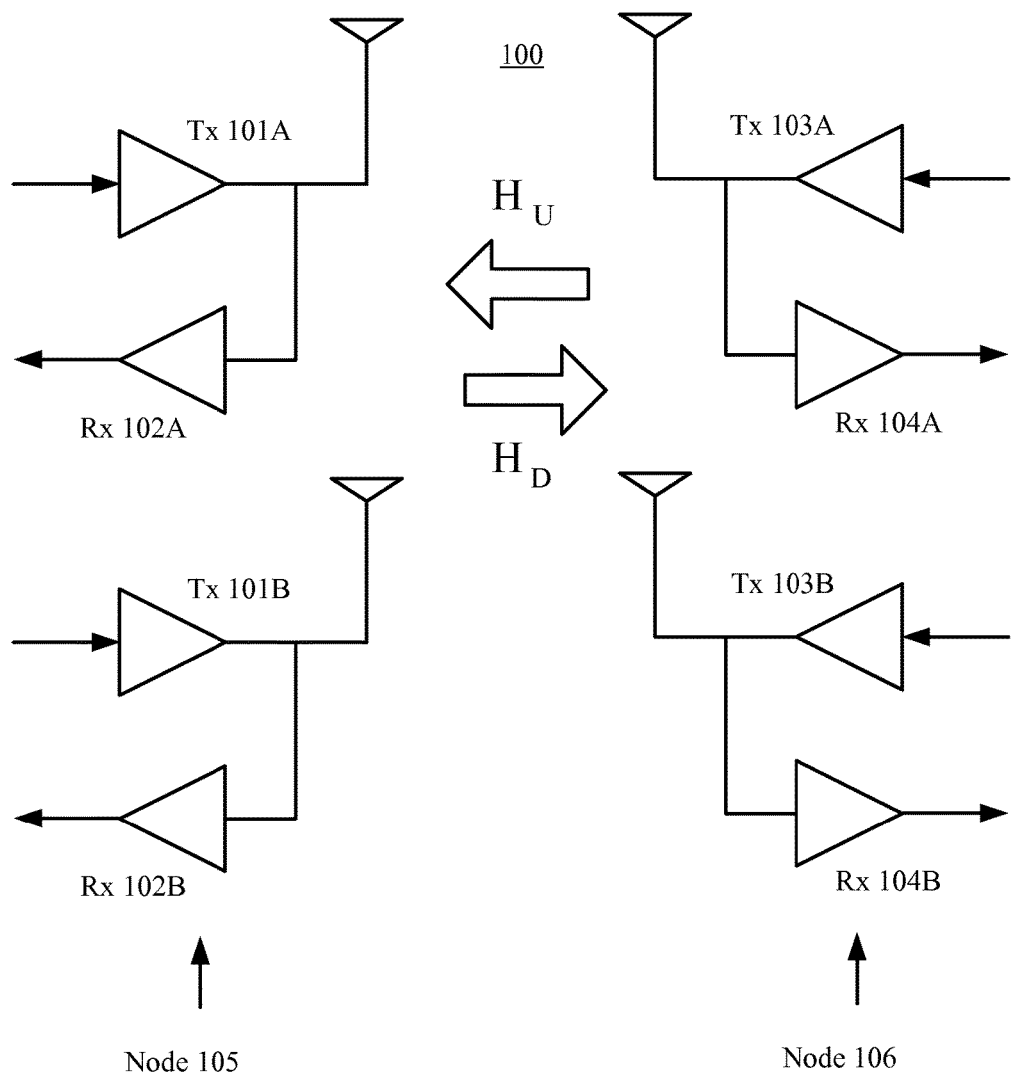
FIG. 1 illustrates a simplified multiple-input multiple-output (MIMO) system in accordance with various aspects of the present disclosure.

In a semi-open loop rate adaptation scheme for a multiple-input multiple-output (MIMO) system, a transmitter can advantageously use one or more quality metrics of an uplink as well as knowledge of transmitter/receiver characteristics of both nodes to perform fast and accurate rate adaptation. FIG. 1 illustrates a simplified MIMO system 100 in which the semi-open loop rate adaptation technique can be used. In MIMO system 100, each transceiver includes a plurality of transmitters (Txs) and receivers (Rxs). For example, a first transceiver, referenced as node 105, can include transmitters 101A and 101B as well as receivers 102A and 102B. A second transceiver, referenced as node 106, can include transmitters 103A and 103B as well as receivers 104A and 104B. Note that each transmitter/receiver pair, e.g., transmitter 101A/receiver 102A, shares an antenna.

MIMO system 100 can divide a data stream into multiple unique streams. Node 105 can modulate each of these multiple streams and then simultaneously transmit each stream through a different antenna in the same frequency channel. By leveraging multipath, i.e., reflections of the signals, each MIMO receive chain of node 106 can be a linear combination of the multiple transmitted data streams. Node 106 can separate these data streams using MIMO algorithms that rely on estimates of the channels between node 105 and node 106.

For purposes of understanding the semi-loop rate adaptation technique, a transmission from node 105 to node 106 is referenced herein as a "downlink" whereas a transmission from node 106 to node 105 is referenced as an "uplink." Note that the terms downlink and uplink merely describe the signal flow direction in a physical channel. Notably, the physical channels between node 105 and node 106 are reciprocal (i.e., exhibit the same characteristics) as long as both downlink and uplink channels use the same frequency. In a mathematical notation, channel reciprocity is represented by $H_D=H_U^T$, where $H_D$ is the downlink channel (i.e., from node 105 to node 106), and $H_U$ is the uplink channel (i.e., from node 106 to node 105).

With channel reciprocity, node 105 can estimate the uplink channel from the packets sent by node 106, and transpose it to obtain the downlink channel, as long as the uplink and downlink packet use the same number of streams. For example, if an acknowledgment (ACK) packet is used as the uplink packet, then the ACK packet needs to be sent using the same number of streams as the downlink packet. (Note that an ACK packet may be sent using a data rate lower than that used to transmit a data packet. Additionally, the ACK packet may or may not be sent using the same power that is typically used for this lower rate.)

Notably, while the physical channel is reciprocal, the radio frequency (RF) circuits in nodes 105 and 106 may not be. Specifically, the optimized rate for the downlink from node 105 to node 106 should be a function of transmitter 101A/101B, the channel from node 105 to node 106, and receiver 104A/104B. In contrast, the optimized rate of the uplink measured at node 105 should be a function of transmitter 103A/103B, the channel from node 106 to node 105, and receiver 102A/102B.

Therefore, in accordance with one aspect of the invention, node 105 can use the transmitter and receiver characteristics of both nodes 105 and 106 to estimate the uplink quality and then compute the equivalent downlink quality. Nodes 105 and 106 can exchange these transmitter and receiver characteristics initially and/or periodically.

Transmitter Characteristics

In one embodiment, the transmitter characteristics can include the transmitter output power per data rate and the transmitter error vector magnitude (EVM) per transmitter output power. With respect to transmitter output power, the power amplifiers of transmitters 101A/101B (node 105) and 103A/103B (node 106) may be asymmetrical, thereby resulting in different transmit powers delivered by each node. Moreover, to add complexity to this asymmetry, the transmit power of a power amplifier can vary per rate and the tolerance of power amplifier non-linearity can depend on the data rate as well as power amplifier implementation specifics. Therefore, to accurately capture the equivalent downlink quality by estimating the uplink quality, node 105 should know the transmit power information per data rate for node 106.

Figure 2:
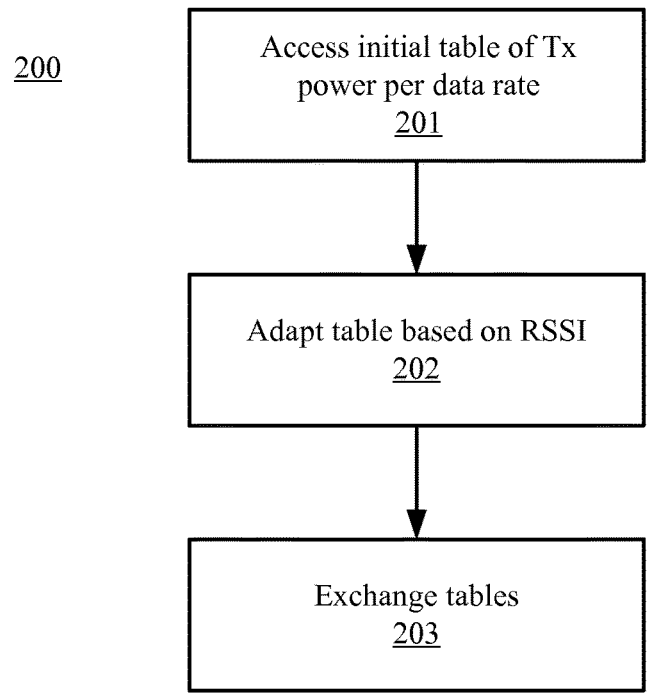
FIG. 2 illustrates an example of a method that may be used to obtain the transmit power information per data rate in accordance with various aspects of the present disclosure.

FIG. 2 illustrates one technique 200 that can be used to obtain the transmit power information per data rate. In step 201, an initial table of transmitter power per data rate can be accessed. In one embodiment, this table can include the worst-case output power vs. rate characteristics. These characteristics can be determined through lab bench testing, for example. Therefore, in one embodiment, this information can be created in step 201. In another embodiment, a vendor can provide this information, thereby allowing immediate use of the table.

In step 202, this table can be slowly adapted, if necessary, based on received signal strength indicator (RSSI) measurements. For example, in one embodiment, the transmit power for the highest rate can be reduced if an ACK RSSI is more than enough to improve a transmit EVM.

In step 203, the transmit power information per data rate tables at the two nodes can be exchanged. That is, the downlink/uplink designation shown in FIG. 1 is from the perspective of node 105. An opposite relationship can be defined from the perspective of node 106. Thus, steps 201, 202, and 203 can be performed at each node in the wireless network. In one embodiment, the transmit power per data rate tables can be exchanged at an initial link setup. In another embodiment, these tables can be updated periodically during operation of the wireless network. Table 1 indicates exemplary transmit powers for various data rates (referenced as MCS0-MCS7).

TABLE 1

Transmit Power Per Data Rate

| Data Rate (MCS) | Transmit Power (dBm) |
| --- | --- |
| MCS0 | 20 |
| MCS1 | 20 |
| MCS2 | 20 |
| MCS3 | 18 |
| MCS4 | 18 |
| MCS5 | 17 |
| MCS6 | 15 |
| MCS7 | 14 |

With respect to transmitter EVM per transmitter output power, the transmitter EVM generally depends on the transmit power due to power amplifier non-linearity. Because transmitter EVM per transmit power is determined by the characteristics of the power amplifier and each node can use different power amplifiers, transmitter EVM information per transmit power can also be exchanged in one embodiment of the invention.

Figure 3:
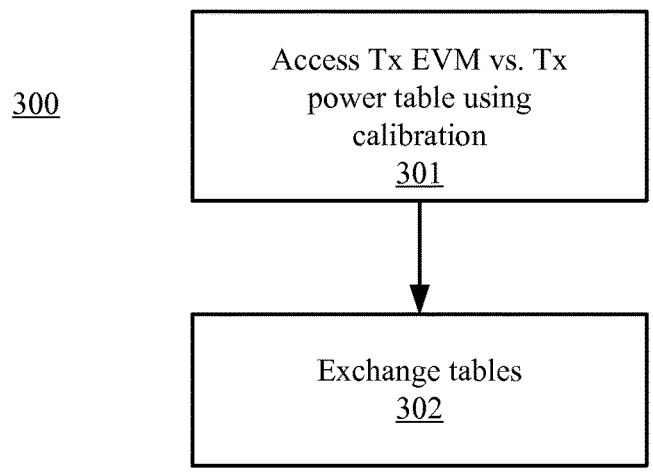
FIG. 3 illustrates an example of a method for accessing and using a transmitter EVM versus transmitter power table in accordance with various aspects of the present disclosure.

FIG. 3 illustrates an example of a method 300 for accessing and using a transmitter EVM versus transmitter power table. In step 301, a transmitter EVM vs. transmitter power table can be accessed. In one embodiment, the transmitter EVM vs. transmitter power table can be created during manufacturing.

Note that this transmitter EVM vs. transmitter power table can include a temperature variation lookup. To use this temperature variation lookup, a temperature sensor can be positioned close to the power amplifier. The temperature difference between the sensor temperature and the room temperature (or, alternatively, the temperature at which the manufacturing calibration was done) can be used to lookup the EVM difference.

In one embodiment, the information in the transmitter EVM vs. transmitter power table can include an initial table based on the calibration temperature, a temperature correction table, and a current temperature. In one embodiment, part-to-part temperature variations can be calibrated during manufacturing, and an average temperature characteristic can be used for all parts. In this manner, only one temperature correction table, based on average temperature characteristics, need be generated.

In another embodiment, step 301 can include a continuous calibration during operation of the device. For example, if feedback from the receiver node is supported, then an EVM can be measured at the receiver node any time a packet is transmitted at any output power level. In one embodiment, to build a complete transmitter EVM vs. transmitter power table, the transmissions can cover all the possible output power levels being used within a given time window (during which the temperature change is negligible).

In step 302, the tables can be exchanged at an initial link setup between the nodes. In one embodiment, the transmitter EVM vs. transmitter power table can be updated periodically during operation of the wireless network.

Note that the above-described transmitter output power per data rate table and the transmitter EVM per transmitter output power table can be combined into a single transmitter EVM per data rate table. Table 2 indicates EVMs for various data rates (referenced as MCS0-MCS7).

TABLE 2

EVM Per Data Rate

| Data Rate (MCS) | Transmit power (dBm) |
|---|---|
| MCS0 | −5 |
| MCS1 | −10 |
| MCS2 | −13 |
| MCS3 | −16 |
| MCS4 | −19 |
| MCS5 | −22 |
| MCS6 | −25 |
| MCS7 | −27 |

Receiver Characteristics

In accordance with one aspect of the invention, the receiver sensitivity, which can be defined as performance per rate, can also be exchanged. Note that the receiver architecture can determine the ease of defining the sensitivity for MIMO systems. In one embodiment, the SNR per stream can be defined after an equalizer in the receiver chain, which is sometimes called "post-detection SNR," which advantageously measures the effect of the equalizer.

The post-detection SNR per stream can be calculated from the channel and the noise floor with a priori knowledge of the MIMO receiver. For example, if a linear receiver including a minimum mean square error (MMSE) detector is used, the post-detection SNR per stream can be derived as follows.

In the downlink transmission from node 105 to node 106, the error covariance matrix of the linear MMSE receiver at node 106 can be defined by the equation:

$$R_e = \delta^2 (H_D^* H_D + \delta^2 I)^{-1}$$

where $\delta^2$ is the noise variance at a receiver of node 106.

The post-detection SNR for a stream i can then be computed using the equation:

$$SNR_i = \frac{1}{r_{e,i}} - 1$$

where $r_{e,i}$ is the $i^{th}$ diagonal element. (Note that $R_e$ is an N×N matrix where N is the number of streams and the diagonal elements of the matrix are elements (1,1), (2,2), . . . (N,N) of $R_e$.)

The receiver sensitivity per rate table can be defined as the post-detection SNR per rate for a given packet error rate (PER). This table can be obtained through lab bench testing or updated periodically based on packet error statistics. In one embodiment, the receiver sensitivity per rate table can be divided into two parts: (1) post-detection SNR to SNR at the decision (i.e., the demodulator) device, and (2) the SNR at the decision device per rate for a given PER. A simple form of the first mapping could be a linear function with clipping (i.e., y=min(x,y_max), where y_max is the maximum SNR achievable in the system given the implementation loss). The second mapping can be obtained by simulations and/or lab bench testing, and will be updated periodically based on packet error statistics.

Note that the SNR at the decision device can be important because the post-detection SNR may not represent the full effects of circuit impairments (e.g., dynamic range, phase noise, etc.). The SNR at the decision device can be measured either by computing EVM with pilots (known signals) or by computing EVM with the data.

Rate Adaptation

Figure 4:
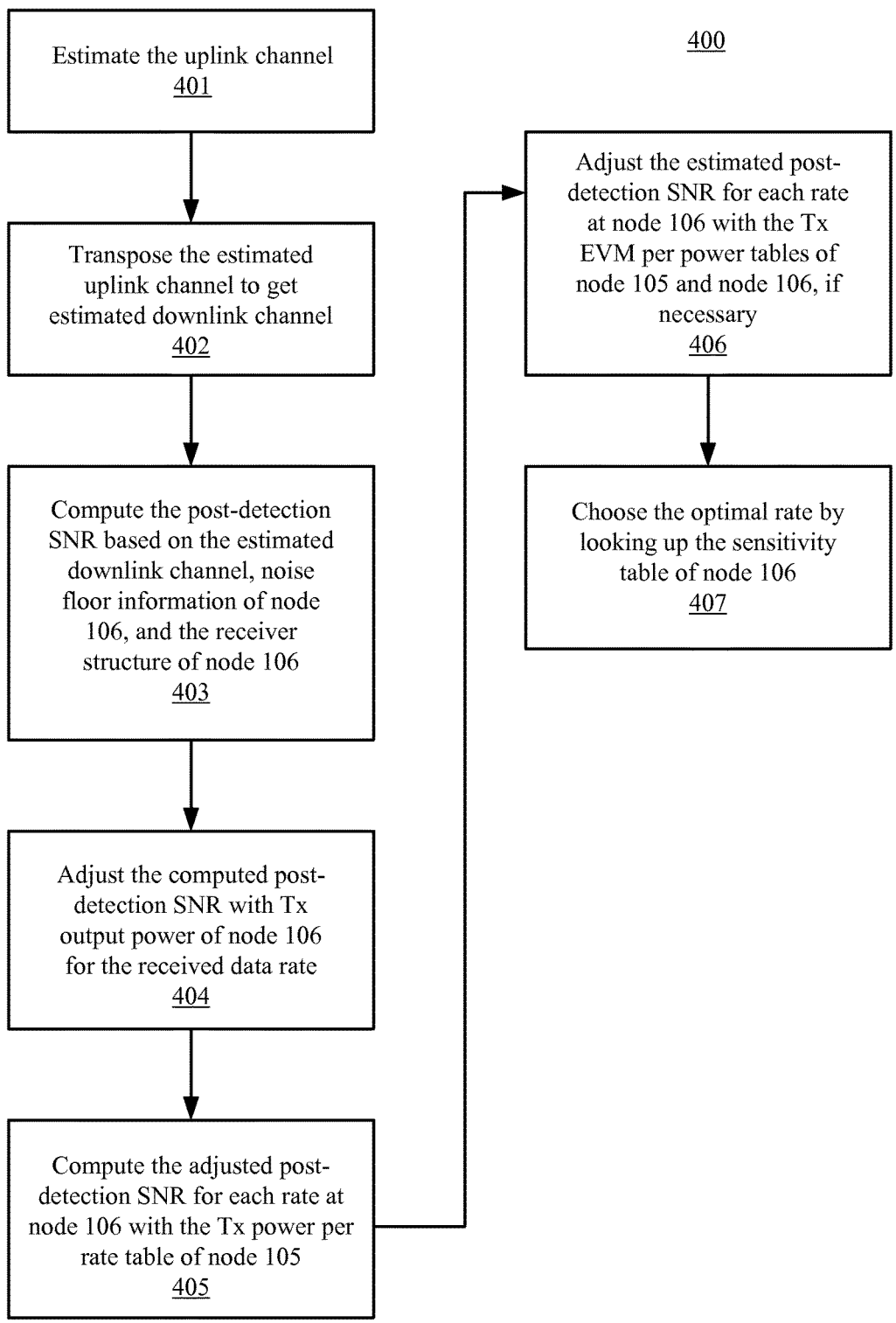
FIG. 4 illustrates an example method that may accurately evaluate the downlink quality of a channel in a MIMO system in accordance with various aspects of the present disclosure.

FIG. 4 illustrates an exemplary technique 400 that node 105 (FIG. 1) can use to evaluate the link quality from node 105 to node 106 (i.e., the downlink quality) by estimating the link quality from node 106 to node 105 (i.e., the uplink quality). In technique 400, while relying on channel reciprocity, node 105 can calibrate the differences in Tx/Rx characteristics between node 105 and node 106 to assess a more accurate downlink quality.

In step 401, node 105 can estimate the uplink channel using channel estimation (i.e., CSI) based on the preamble (i.e., training fields). In step 402, node 105 can transpose the estimated uplink channel (i.e., by making row elements into column elements and vice versa) to get the downlink channel. In step 403, node 105 can compute the post-detection SNR of node 106 based on the downlink channel, the noise floor information of node 106 (as measured by node 106 and provided to node 105), and the receiver structure of node 106 (e.g., like the type of channel equalizer: MMSE equalizer or zero forcing (ZF) equalizer, or another type of structure). In step 404, node 105 can adjust the computed post-detection SNR with the transmitter output power of node 106 for the received data rate. In step 405, node 105 can compute the post-detection SNR for each rate at node 106 with the transmitter power per rate table of node 105, thereby building a sensitivity table for node 106. In step 406 (in one embodiment, an optional step), node 105 can adjust the estimated post-detection SNR for each rate at node 106 with the transmitter EVM per power tables of node 105 and node 106, if necessary (e.g., when the transmitter EVM is not negligible (e.g., if the EVM is more than 10 dB below the SNR). In step 407, node 105 can choose the optimized rate by referring to the post-detection SNR per rate table of node 106. In one embodiment, the optimized rate is the highest rate whose estimated post-detection SNR is larger than the required (i.e., the minimum SNR to get to less than 10% PER).

Figure 5:
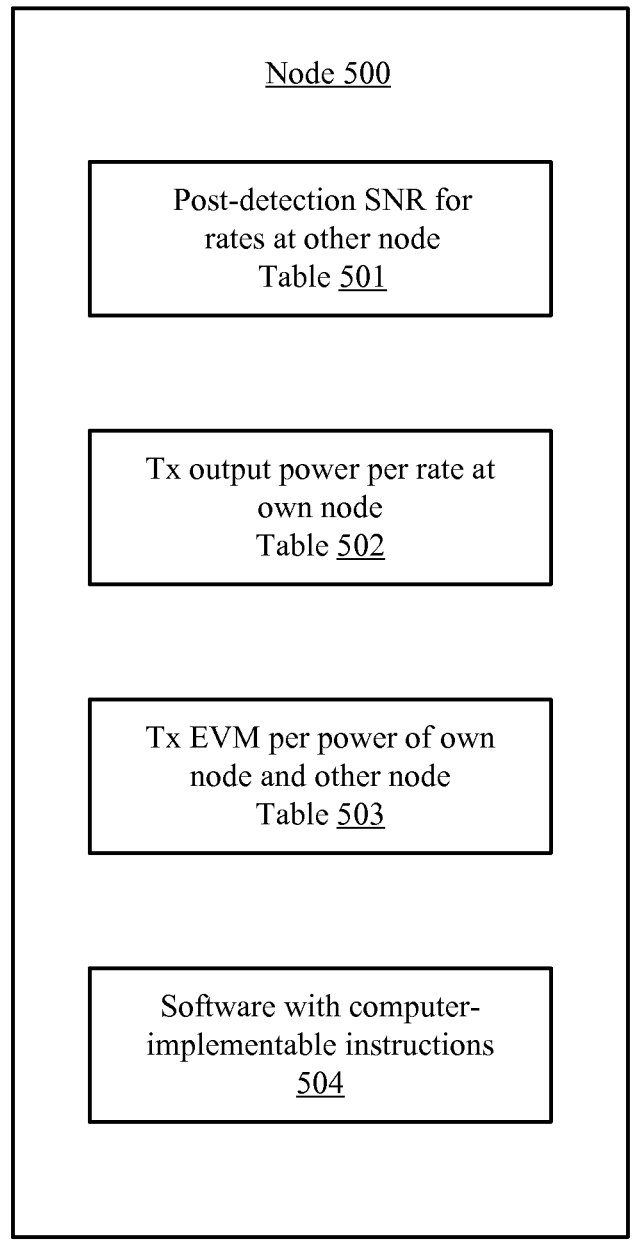
FIG. 5 illustrates an example of a node including various tables that may be accessed by software with computer-executable instructions.

FIG. 5 illustrates a node 500 including various tables that can be accessed by software with computer-implementable instructions. Specifically, node 500 can include a table 501 that indicates the post-detection SNR for rates at node 106 (FIG. 1). This table is also called a sensitivity table herein. Node 500 can further include a table 502, which indicates transmitter output power per rate at node 105, as well as a table 503, which indicates a transmitter EVM per power of nodes 105 and 106. Tables 501, 502, 503 can be stored using any standard memory devices or structures. Notably, node 500 can further include software 504 with computer-implementable instructions (residing on a computer-readable medium) for accessing tables 501, 502, and 503 and performing technique 400 (FIG. 4).

Miscellaneous Probing

In accordance with one aspect of the invention, probing can be advantageously used to determine the optimized number of streams for the MIMO system, the guard intervals to be used for the packets forming those streams, and the bandwidth (i.e., 20/40 MHz) to be used.

The choice of the number of streams can significantly affect the success of rate adaptation. Notably, conventional channel estimation can readily determine that reducing the number of streams is appropriate. However, determining whether increasing the number of stream is appropriate can be difficult using standard techniques. In one embodiment, additional channel estimation can be performed using probes to determine if increasing the number of streams is appropriate. For example, to obtain more channel information, a device can periodically probe for a larger number of streams. As described above, if the uplink packet (e.g., an ACK packet) always uses the same number of streams as the downlink packet (e.g., a data packet), then the reverse channel can be advantageously estimated.

Orthogonal frequency division multiplexing (OFDM) can advantageously reduce multipath distortion in a MIMO system. Specifically, the densely packed subcarriers in the MIMO system are orthogonal to ensure non-interference even under multipath conditions. An OFDM symbol includes a fast Fourier transform (FFT) interval (from which the data is extracted) preceded by a guard interval. The guard interval can advantageously serve as a repository for echoes from the previous symbol, thereby preventing such echoes from adversely affecting the subsequent FFT interval. In one embodiment, the guard interval can be 800 ns in duration, which is commensurate with the longest indoor multipath. In another embodiment, the guard interval can be 400 ns in duration, which is commensurate with the longest indoor multipath of a home or small office environment. In yet another embodiment, the guard interval can be 1600 ns in duration, which is commensurate with the longest outdoor multipath. As used herein, the terms "half guard interval" and "full guard interval" refer to the 400 ns and 800 ns durations.

Because determining the appropriate guard interval is based on the operating environment (i.e., the delay spread of the channel) rather than fading, a rate table of various rates and their associated guard intervals can be developed over time. That is, the choice of guard interval can be different for each data rate because different data rates will have different sensitivities to multipath. Note that this rate table will depend on the environment, although the delay spread is assumed to be unchanged during the period. For example, in contrast to an outdoor environment, an indoor environment is relatively static.

In one embodiment, the guard interval choice can be determined by either measuring the channel flatness (e.g., how correlated is the channel from one bin to another bin. If the delay spread is small, then the channel variation is small. For example, a "0" delay spread channel is flat in the frequency domain. On the other hand, if the delay spread is large, then the channel varies significantly from bin to bin) directly (e.g., using channel estimations) and using this measurement as an index to determine which rates should use full guard intervals or reduced guard intervals. In another embodiment, packets can be sent with both full and reduced guard intervals. At this point, the EVMs associated with those packets and then the EVM difference between those two packets can be measured. The EVM difference can be used to determine if the impact to the EVM is sufficient to preclude the use of the most effective rates.

In one embodiment, the receiver that receives the packets can make this determination and provide feedback in a closed loop manner to the transmitter. In another embodiment, reciprocity can be used such that the uplink packets always use the same guard interval setting. In this case, the transmitter can estimate the flatness or EVM of the uplink packets when the downlink packets are sent using a different guard interval.

According to the IEEE 802.11 family of standards, which governs wireless communications, each frequency band includes a predetermined number of frequency channels. For example, the 2.4 GHz frequency band includes 14 channels, wherein each channel when occupied has a 22 MHz bandwidth and the center frequencies of adjacent channels are 5 MHz apart. In contrast, 5 GHz frequency band includes 12 channels, wherein each channel when occupied has a 20 MHz bandwidth and the center frequencies of adjacent channels are 20 MHz apart.

Notably, using a wider channel could advantageously increase capacity, i.e., the transfer rate. Specifically, a 40 MHz channel always has greater capacity than a 20 MHz channel, and increasingly so as the signal to noise ratio (SNR) increases. In one embodiment, the 20/40 MHz decision can be separate from the rate adaptation determination. There are three modes of operations: 40 MHz, mixed 40 MHz/20 MHz, and 20 MHz.

If no or minimal interference is present on the extension channel, then the device can operate in the 40 MHz mode. In this case, the receiver can perform dynamic 20/40 MHz detection on a packet-by-packet basis. In this mode, the transmitter can transmit 40 MHz packets unless certain conditions exist (e.g., the MAC times out due to 40 MHz CCA busy or multi-rate retry to send failing 40 MHz packets at 20 MHz). Note that 6 Mbps and 20 MHz is currently the last rate in the rate table.

If weak interference exists on the extension channel, then the device can operate in the mixed 20/40 MHz mode. In this case, the receiver can perform dynamic 20/40 MHz detection on a packet-by-packet basis. Note that although the transmitter can transmit 20 MHz packets, the carrier frequency can be set as if for 40 MHz transmission.

If heavy interference exists on the extension channel, then the device can operate solely in the 20 MHz mode. In this case, the carrier frequency can be set at the middle of the 20 MHz band, the receiver only detects 20 MHz packets, and the transmitter transmits only 20 MHz packets.

Switching between modes can be based on the long term sensing of extension channel activity. In one embodiment, switching between modes can be limited to be between the 40 MHz mode and the 40/20 MHz mixed mode or, alternatively, between the 40/20 MHz mixed mode and the 20 MHz mode.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. For example, although a MIMO system is discussed in detail herein, semi-open technique 400 can be readily suited for any time division duplex (TDD) system. Accordingly, it is intended that the scope of the invention be defined by the following Claims and their equivalents.

What is claimed is:

1. A method for adapting a rate in a multiple-input multiple-output (MIMO) system, comprising:
   receiving, by a first node, from a second node, transmitter and/or receiver characteristics of the second node, the transmitter and/or receiver characteristics of the second node comprising at least one member selected from the group consisting of: a transmitter power per data rate table of the second node, a transmitter error vector magnitude (EVM) per transmitter power table of the second node, and a receiver sensitivity per data rate table of the second node including a first post-detection signal-to-noise ratio (SNR) per rate for a first packet error rate (PER);
   transmitting, by the first node, to the second node, transmitter and/or receiver characteristics of the first node, the transmitter and/or receiver characteristics of the first node comprising at least one member selected from the group consisting of: a transmitter power per data rate table of the first node, a transmitter EVM per transmitter power table of the first node, and a receiver sensitivity per data rate table of the first node including a second post-detection SNR per rate for a second PER; and
   adapting, by the first node, a data rate from the first node to the second node based at least in part on the transmitter and/or receiver characteristics of the first node and the transmitter and/or receiver characteristics of the second node.

2. The method of claim 1, further comprising:
   after transmitting transmitter and/or receiver characteristics of the first node to the second node, receiving, by the first node, information from the second node at an adapted data rate from the second node to the first node, wherein the adapted data rate from the second node to the first node is based at least in part on the transmitter and/or receiver characteristics of the first node and the transmitter and/or receiver characteristics of second node.

3. The method of claim 1, further comprising:
   adjusting the transmitter power per data rate table of the first node based at least in part on a received signal strength indicator (RSSI);
   wherein transmitting the transmitter and/or receiver characteristics of the first node comprises transmitting the transmitter power per data rate table of the first node to the second node upon adjusting the transmitter power per data rate table of the first node.

4. The method of claim 1, wherein transmitting the transmitter and/or receiver characteristics of the first node comprises transmitting the transmitter power per data rate table of the first node to the second node during an initial link setup between the first node and the second node.

5. The method of claim 3, wherein adjusting the transmitter power per data rate table of the first node is to be performed periodically.

6. The method of claim 1, wherein transmitting the transmitter EVM per transmitter power table of the first node comprises:
   updating the transmitter EVM per transmitter power table of the first node based at least in part on a temperature variation of the first node; and
   transmitting the transmitter EVM per transmitter power table of the first node to the second node.

7. The method of claim 1, wherein the transmitter and/or receiver characteristics of the second node comprise at least one member selected from the group consisting of the transmitter power per data rate table of the second node and the transmitter error vector magnitude (EVM) per transmitter power table of the second node; and wherein adapting the data rate from the first node to the second node comprises:
   estimating an uplink channel of the first node;
   transposing the estimated uplink channel of the first node to estimate a downlink channel of the first node;
   adjusting the first post-detection SNR per rate of the second node for a received data rate based at least in part on the transmitter power per data rate table of the second node; and
   selecting one of the plurality of data rates as the data rate from the first node to the second node based at least in part on the receiver sensitivity per data rate table of the second node.

8. The method of claim 7, further comprising:
   adjusting the first post-detection SNR of the second node for each of the plurality of data rates based at least in part on the transmitter EVM per transmitter power table of the first node and the transmitter EVM per transmitter power table of the second node.

9. The method of claim 7, wherein selecting the one of the plurality of data rates comprises identifying one of the plurality of data rates having an estimated post-detection SNR that is larger than a threshold SNR.

10. The method of claim 1, wherein the adapted data rate is a function of at least one transmitter of the first node, a channel from the first node to the second node, and at least one receiver of the second node.

11. The method of claim 1, wherein the adapted data rate is a function of at least one transmitter of the second node, a channel from the second node to the first node, and at least one receiver of the first node.

12. A communications device for adapting a rate in a multiple-input multiple-output (MIMO) system, comprising a transceiver to:
   receive, by a first node, from a second node, transmitter and/or receiver characteristics of the second node, the transmitter and/or receiver characteristics of the second node comprising at least one member selected from the group consisting of: a transmitter power per data rate table of the second node, a transmitter error vector magnitude (EVM) per transmitter power table of the second node, and a receiver sensitivity per data rate table of the second node including a first post-detection signal-to-noise ratio (SNR) per rate for a first packet error rate (PER);
   transmit, by the first node, to the second node, transmitter and/or receiver characteristics of the first node, the transmitter and/or receiver characteristics of the first node comprising at least one member selected from the group consisting of: a transmitter power per data rate table of the first node, a transmitter EVM per transmitter power table of the first node, and a receiver sensitivity per data rate table including a second post-detection SNR per rate for a second PER of the first node; and
   adapt, by the first node, a data rate from the first node to the second node based at least in part on the transmitter and/or receiver characteristics of the first node and the transmitter and/or receiver characteristics of the second node.

13. The communications device of claim 12, the transceiver is further to:
  after transmitting transmitter and/or receiver characteristics of the first node to the second node, receive, by the first node, information from the second node at an adapted data rate from the second node to the first node, wherein the adapted data rate from the second node to the first node is based at least in part on the transmitter and/or receiver characteristics of the first node and the transmitter and/or receiver characteristics of second node.

14. The communications device of claim 12, the transceiver is further to:
  adjust the transmitter power per data rate table of the first node based at least in part on a received signal strength indicator (RSSI);
  wherein the transceiver transmits the transmitter power per data rate table of the first node to the second node upon adjusting the transmitter power per data rate table of the first node.

15. The communications device of claim 12, wherein the transceiver transmits the transmitter power per data rate table of the first node to the second node during an initial link setup between the first node and the second node.

16. The communications device of claim 14, wherein the transceiver adjusts the transmitter power per data rate table of the first node periodically.

17. The communications device of claim 12, wherein the transceiver transmits the transmitter EVM per transmitter power table of the first node by:
  updating the transmitter EVM per transmitter power table of the first node based at least in part on a temperature variation of the first node; and
  transmitting the transmitter EVM per transmitter power table of the first node to the second node.

18. The communications device of claim 12, wherein the transmitter and/or receiver characteristics of the second node comprises at least one member selected from the group consisting of the transmitter power per data rate table of the second node and the transmitter error vector magnitude (EVM) per transmitter power table of the second node; and
  wherein the transceiver adapts the data rate by:
    estimating an uplink channel of the first node;
    transposing the estimated uplink channel of the first node to estimate a downlink channel of the first node;
    adjusting the first post-detection SNR of the second node for a received data rate based at least in part on the transmitter power per data rate table of the second node; and
    selecting one of the plurality of data rates as the data rate from the first node to the second node based at least in part on the receiver sensitivity per data rate table of the second node.

19. The communications device of claim 18, the transceiver is further to:
  adjust the first post-detection SNR of the second node for each of the plurality of data rates based at least in part on the transmitter EVM per transmitter power table of the first node and the transmitter EVM per transmitter power table of the second node.

20. The communications device of claim 18, wherein the transceiver selects the one of the plurality of data rates by identifying one of the plurality of data rates having an estimated post-detection SNR that is larger than a threshold SNR.

21. The communications device of claim 12, wherein the adapted data rate is a function of at least one transmitter of the first node, a channel from the first node to the second node, and at least one receiver of the second node.

22. The communications device of claim 12, wherein the adapted data rate is a function of at least one transmitter of the second node, a channel from the second node to the first node, and at least one receiver of the first node.

23. A non-transitory computer-readable medium storing instructions executable by a processor to cause a device to:
  receive, by a first node, from a second node, transmitter and/or receiver characteristics of the second node, the transmitter and/or receiver characteristics of the second node comprising at least one member selected from the group consisting of: a transmitter power per data rate table of the second node, a transmitter error vector magnitude (EVM) per transmitter power table of the second node, and a receiver sensitivity per data rate table of the second node including a first post-detection signal-to-noise ratio (SNR) per rate for a first packet error rate (PER);
  transmit, by the first node, to the second node, transmitter and/or receiver characteristics of the first node, the transmitter and/or receiver characteristics of the first node comprising at least one member selected from the group consisting of: a transmitter power per data rate table of the first node, a transmitter EVM per transmitter power table of the first node, and a receiver sensitivity per data rate table of the first node including a second post-detection SNR per rate for a second PER; and
  adapt, by the first node, a data rate from the first node to the second node based at least in part on the transmitter and/or receiver characteristics of the first node and the transmitter and/or receiver characteristics of the second node.

24. The non-transitory computer-readable medium of claim 23, wherein the instructions further comprise instructions executable by the processor to cause the device to:
  after transmitting transmitter and/or receiver characteristics of the first node to the second node, receive, by the first node, information from the second node at an adapted data rate from the second node to the first node, wherein the adapted data rate from the second node to the first node is based at least in part on the transmitter and/or receiver characteristics of the first node and the transmitter and/or receiver characteristics of second node.

25. The non-transitory computer-readable medium of claim 23, wherein the instructions further comprise instructions executable by the processor to cause the device to:
  adjust the transmitter power per data rate table of the first node based at least in part on a received signal strength indicator (RSSI);
  wherein the instructions executable by the processor to cause the device to transmit the transmitter and/or receiver characteristics of the first node comprise instructions executable by the processor to cause the device to transmit the transmitter power per data rate table of the first node to the second node upon adjusting the transmitter power per data rate table of the first node.

26. The non-transitory computer-readable medium of claim 23, wherein the instructions executable by the processor to cause the device to transmit the transmitter and/or receiver characteristics of the first node comprise instructions executable by the processor to cause the device to transmit the transmitter power per data rate table of the first node to the second node during an initial link setup between the first node and the second node.

27. The non-transitory computer-readable medium of claim 23, wherein the instructions executable by the processor to cause the device to transmit the transmitter EVM per transmitter power table of the first node comprise instructions executable by the processor to cause the device to:
   update the transmitter EVM per transmitter power table of the first node based at least in part on a temperature variation of the first node; and
   transmit the transmitter EVM per transmitter power table of the first node to the second node.

28. The non-transitory computer-readable medium of claim 23, wherein the transmitter and/or receiver characteristics of the second node comprises at least one member selected from the group consisting of the transmitter power per data rate table of the second node and the transmitter error vector magnitude (EVM) per transmitter power table of the second node; and wherein the instructions executable by the processor to cause the device to adapt the data rate from the first node to the second node based at least in part on the transmitter and/or receiver characteristics of the first node and the transmitter and/or receiver characteristics of the second node comprise instructions executable by the processor to cause the device to:
   estimate an uplink channel of the first node;
   transpose the estimated uplink channel of the first node to estimate a downlink channel of the first node;
   adjust the first post-detection SNR of the second node for a received data rate based at least in part on the transmitter power per data rate table of the second node; and
   select one of the plurality of data rates as the data rate from the first node to the second node based at least in part on the receiver sensitivity per data rate table of the second node.

29. The non-transitory computer-readable medium of claim 28, wherein the instructions further comprise instructions executable by the processor to cause the device to:
   adjust the first post-detection SNR of the second node for each of the plurality of data rates based at least in part on the transmitter EVM per transmitter power table of the first node and the transmitter EVM per transmitter power table of the second node.

30. The non-transitory computer-readable medium of claim 28, wherein the instructions further comprise instructions executable by the processor to cause the device to:
   select the one of the plurality of data rates by identifying one of the plurality of data rates having an estimated post-detection SNR that is larger than a threshold SNR.

* * * * *